United States Patent [19]

Reading

[11] Patent Number: 5,136,257

[45] Date of Patent: Aug. 4, 1992

[54] RF AMPLIFIER BIAS CIRCUIT

[75] Inventor: Ian Reading, South Queensferry, Scotland

[73] Assignee: Hewlett-Packard Company, Palo Alto, Calif.

[21] Appl. No.: 447,238

[22] Filed: Dec. 7, 1989

[30] Foreign Application Priority Data

Dec. 8, 1988 [EP] European Pat. Off. ............ 8828635

[51] Int. Cl.$^5$ ............................................. H03G 3/30
[52] U.S. Cl. .................... 330/129; 330/134; 330/144; 330/279; 330/284; 330/285
[58] Field of Search ............... 330/127, 129, 144, 145, 330/279, 284, 285, 133, 134

[56] References Cited

U.S. PATENT DOCUMENTS

| | | | |
|---|---|---|---|
| 3,581,222 | 5/1971 | Dunwoodie | 330/29 |
| 4,412,182 | 10/1983 | Yochum | 330/129 X |
| 4,442,407 | 4/1984 | Apel | 330/129 X |
| 4,458,213 | 7/1984 | Quan | 330/267 |
| 4,500,848 | 2/1985 | Marchano et al. | 330/285 |
| 4,510,460 | 4/1985 | Tamura | 330/285 |
| 4,518,927 | 5/1985 | Koppe et al. | 330/284 |
| 4,523,155 | 6/1985 | Walczak et al. | 330/279 |
| 4,546,326 | 10/1985 | Van Uffelen et al. | 330/279 X |
| 4,602,218 | 7/1986 | Vilmur et al. | 330/129 X |
| 4,606,075 | 8/1986 | Eastmond | 455/234 |
| 4,636,741 | 1/1987 | Mitzlaff | 330/127 |
| 4,859,964 | 8/1989 | Jorgensen | 330/129 X |

FOREIGN PATENT DOCUMENTS 2210335 6/1974 France.
244107 12/1985 Japan .................................. 330/279

OTHER PUBLICATIONS

M. F. Farley, "Digital Approach Provides Precise Programmable AGC", Electronics, vol. 44, No. 18, 30th pp. 52-56, New York, US (Aug. 1971).

W. P. O'Reilly, "Transmitter Power Amplifier Design - 1", Wireless World, vol. 81, No. 1477, pp. 417-422, Haywards Heath, GB (Sep. 1975).

N. P. McKay, "Wideband Signal-Limiters", Post Office Electrical Engineers Journal, vol. 62, No. 4, pp. 213-217, London, GB (Jan. 1970).

Primary Examiner—James B. Mullins

[57] ABSTRACT

An amplifier circuit includes an amplifier and a biasing circuit. A control circuit generates an amplifier output level control voltage which is coupled to the biasing circuit for controlling the operating point of the amplifier in response to the level of control voltage.

10 Claims, 5 Drawing Sheets

RF AMPLIFIER BIAS CIRCUIT

BACKGROUND OF THE INVENTION

The present invention relates to an RF amplifier bias circuit.

Initially, the biasing of transistor amplifiers was accomplished using purely resistive elements. For many reasons this is not the best approach to biasing broad band RF amplifiers. Typically the high frequency RF transistor, around which the RF amplifier stage is constructed, has its bias conditions [collector current ($I_c$) and collector voltage ($V_c$)] maintained by another, lower performance transistor circuit. This technique is known as Active Biasing, and is employed in many types of RF amplifiers.

FIG. 1 of the accompanying drawings shows a conventional, prior art active bias arrangement for an RF amplifier. An RF amplifier is indicated at 10 and an active bias circuit is indicated at 12.

The RF amplifier 10 includes an npn transistor 14 having a feedback stabilizing arrangement with a resistor $R_F$, inductor $L_F$, and capacitor $C_F$. The transistor 14 has an inductor $L_C$ (RF choke) connected to its collector lead and has a grounded resistor $R_e$ connected to its emitter lead. The input and output RF signals are indicated at $RF_{IN}$ and $RF_{OUT}$ respectively.

The active bias circuit 12 includes a pnp transistor 16 with a resistor $R_b$ connected to its collector lead and a bias resistor $R_c$ connected to its emitter lead. The bias resistor $R_c$ is also connected to the inductor $L_c$.

During operation, a fixed reference voltage $V_{ref}$ is supplied to the base of the transistor 16 and the supply voltage is $V_{cc}$. The collector current $I_c$ of the transistor 14 is given by:

$$I_c = \frac{V_{cc} - V_c}{R_c}$$

The collector voltage $V_c$ of the transistor 14 is given by:

$$V_c = V_{ref} + 0.7\ V$$

Signal generators, and some other applications of broad band RF power amplifiers require operation in two modes:
 i) Moderate output power (around 12 dBm) with good harmonic performance (−40 dBc).
 ii) High output power (around 20 dBm) with unspecified harmonic performance.

In signal generation, the RF amplifiers may be used to form part of an Automatic Level Control (ALC) loop in the prior art level feedback control system shown in FIG. 2. RF amplifiers 22,24 and 26, differential amplifier 28 and a modulator 30 generally comprise the feedback control system. The modulator 30 is typically a three PIN diode modulator. The RF amplifier 26 is connected to the negative input of the differential amplifier 28 via a detector diode 32. An RF level control voltage is supplied to the positive input of the differential amplifier 28. The RF power output from RF amplifier 26 is detected and compared with the RF level control voltage which is derived elsewhere in the instrument. The difference between the desired and detected RF level is used to generate an error signal which controls the modulator 30, changing the RF level input to the RF amplifier 22. In this way, the RF power out of the amplifier can be continuously varied through the two modes of operation mentioned above, as generally known to those skilled in the art.

Typical RF transistors used in an RF amplifier such as the Motorola MRF 581, have power output and harmonic performance which vary with $V_c$ and $I_c$. In addition the product $V_c$ times $I_c$ constitutes the power dissipation in the transistor which is limited by the device packaging, heatsinking and specification. In conventional active biasing, a single value of $V_c$ and $I_c$ are chosen to give good performance in both operating modes while maintaining a low power dissipation. The relationship between $V_c$, $I_c$ and transistor performance are such that increasing $V_c$ yields better harmonic performance with little effect on maximum output power, while increasing $I_c$ improves maximum output power before clipping and compression, with some degradation of harmonics.

FIGS. 3 and 4 illustrate the relationship between $V_c$ and harmonic performance and between $I_c$ and power output respectively in a typical prior art amplifier, such as for example, the Motorola MRF 581.

SUMMARY OF THE INVENTION

It is an object of this invention to provide dynamic biasing of an amplifier so as to optimize high power and good harmonic performance while maintaining low power dissipation.

It is a further object of this invention to obtain improved amplifier linearity with varying power thereby providing improved accuracy and minimized distortion when employing amplitude modulation and an automatic level control.

It is a still further object of this invention to optimize the values of $I_c$ and $V_c$ for RF transistors thereby making the amplifiers using such transistors more tolerant to device variations.

It is a still further object of this invention to achieve dynamic biasing while minimizing the cost of components.

In accordance with these other objects of the invention, a method and apparatus are provided using an amplifier having an input and an output, a biasing circuit coupled to the amplifier and a control means for generating a level control voltage coupled to the biasing circuit. The output of the amplifier is coupled to the biasing circuit so as to control the operating bias point of the amplifier in response to the level control voltage.

In accordance with this invention, the method and apparatus may be utilized with a plurality of cascaded amplifiers having their respective operating bias points dynamically controlled.

In a preferred embodiment of the invention, the comparison means are coupled to the amplifier and the control means for generating an error signal representing the difference between the amplifier output and the level control voltage. Modulating means are coupled to the amplifier and a comparison means for modulating the input to the amplifier with the error signal.

Dynamic biasing in this way allows the operating bias point ($V_c$ and $I_c$) to be continuously varied as a function of desired output power. When a moderate output is desired, with good harmonics, a high value of $V_c$ can be used with a low value of $I_c$. When a high RF power with unspecified harmonics is required a high value of $I_c$ can be used. $V_c$ is reduced in sympathy with the increasing $I_c$ to maintain low dissipation.

DETAILED DESCRIPTION OF A PREFERRED EMBODIMENT

Figure 1:
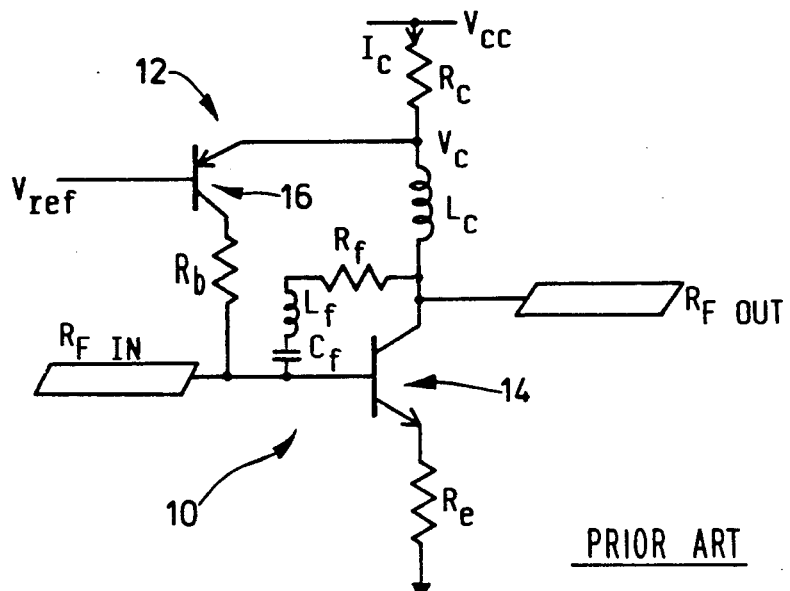
FIG. 1 as discussed above is a schematic diagram of a prior art amplifier having an active bias arrangement.
Figure 2:
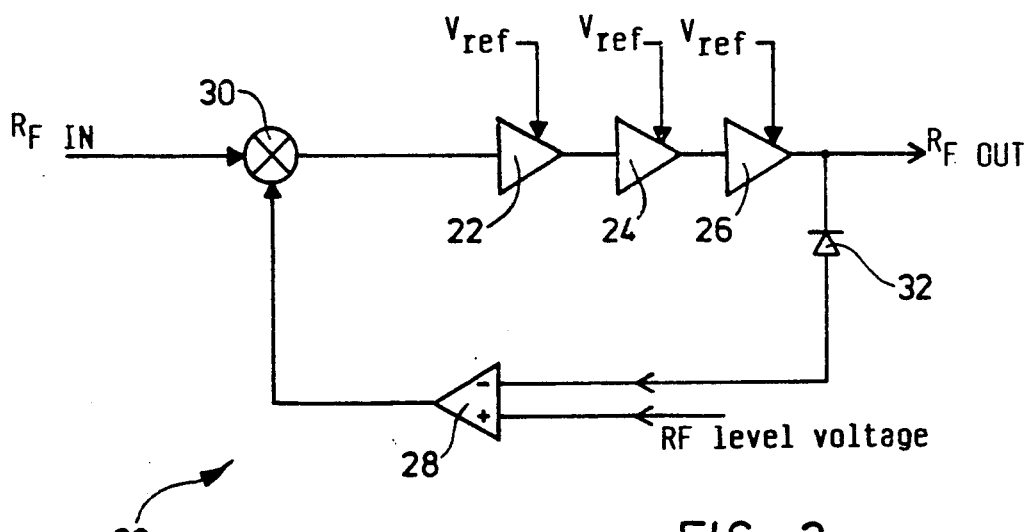
FIG. 2 as discussed above is a schematic diagram of a prior art Automatic Level Control (ALC loop) using prior art amplifiers.
Figure 3:
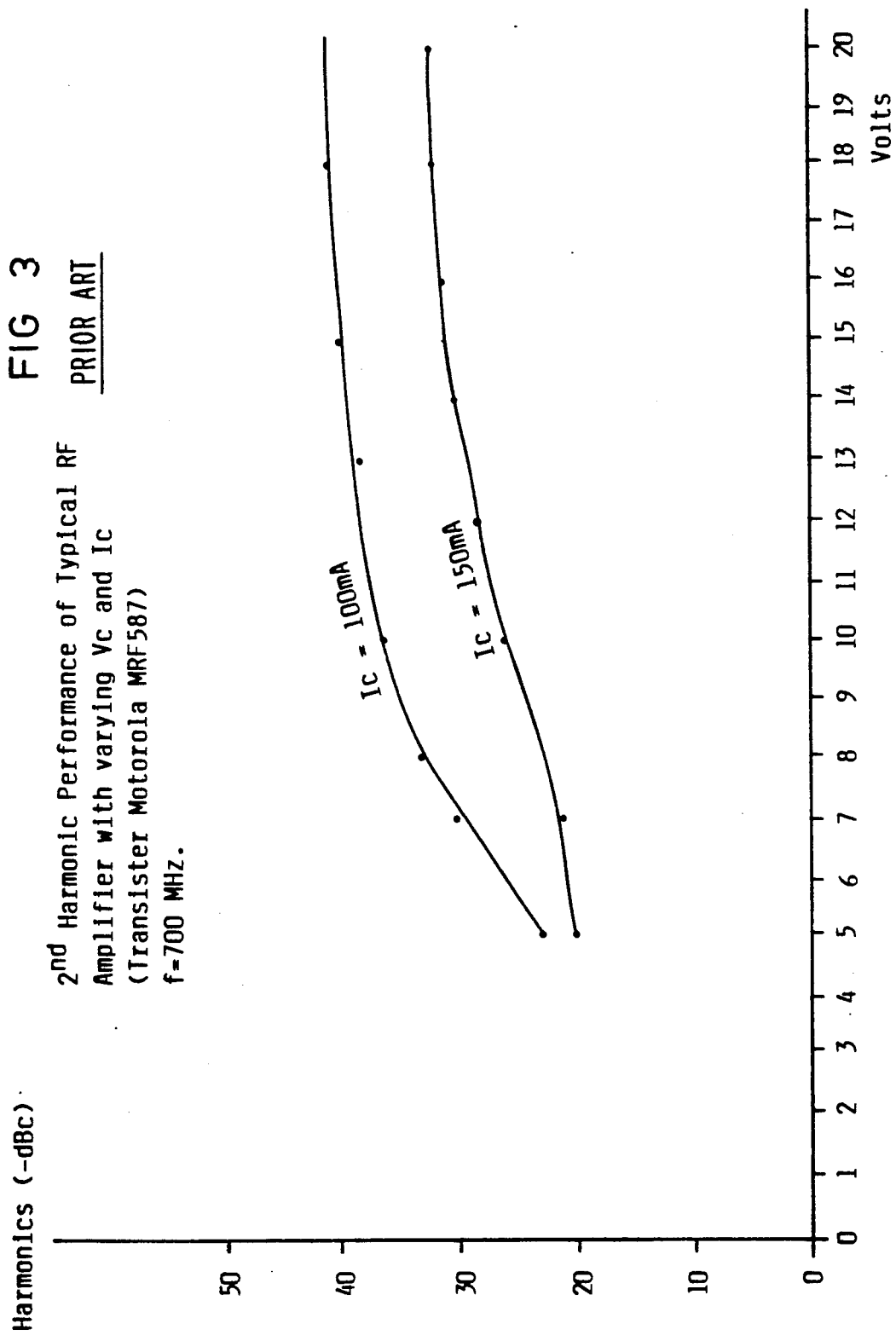
FIGS. 3 and 4 as discussed above graphically plot the relationship of $V_{cc}$ and harmonic performance and $I_c$ and power output respectively for prior art amplifiers.
Figure 4:
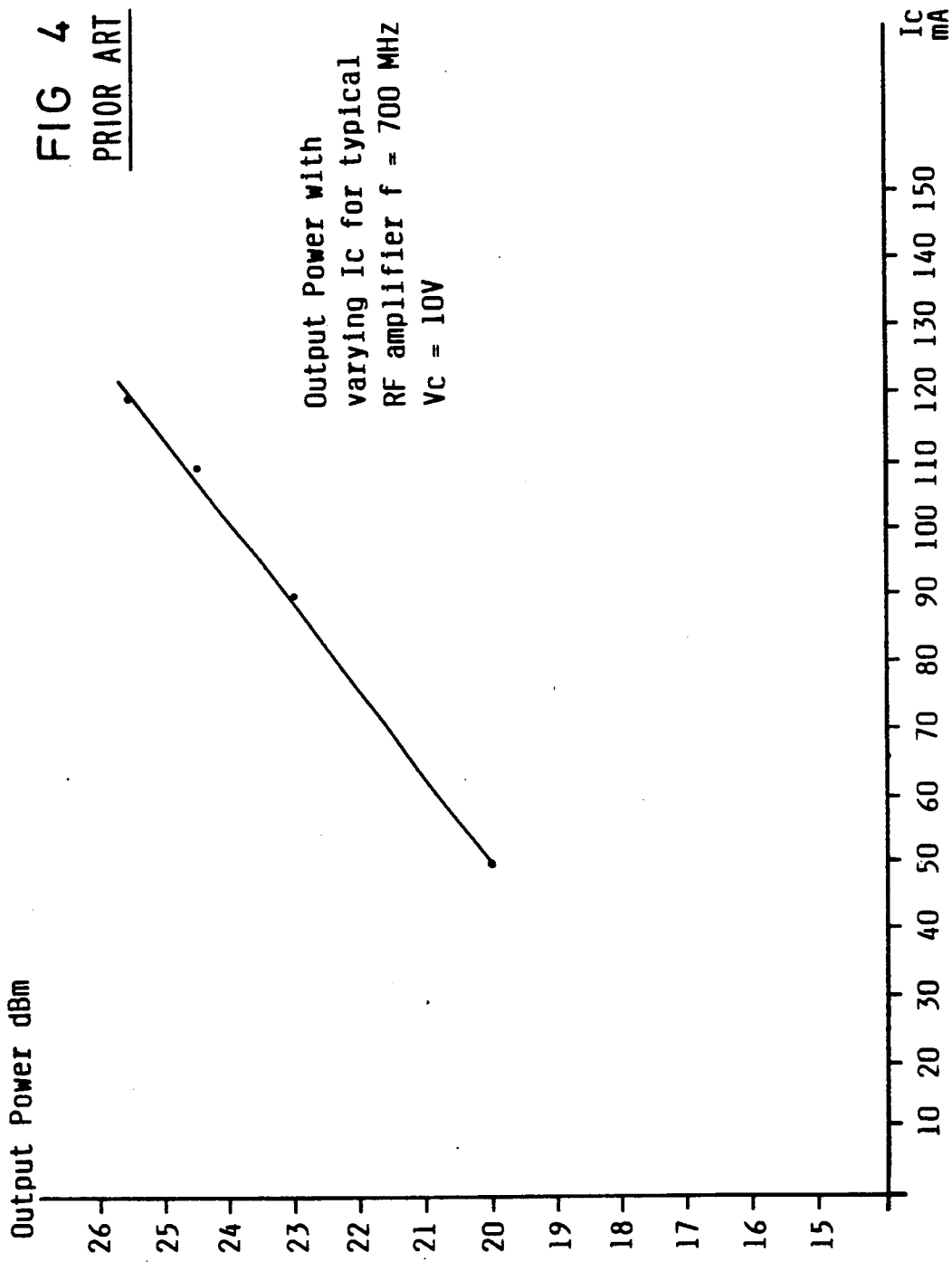
Figure 5:
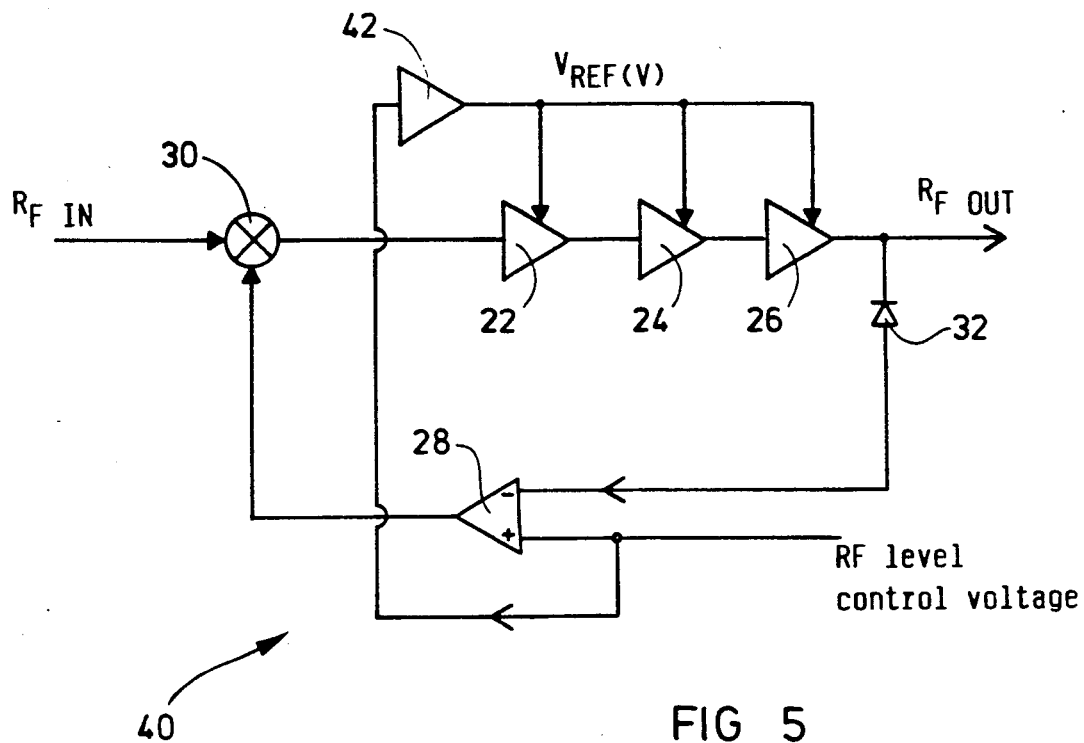
FIG. 5 is a schematic diagram of the feedback control system of the present invention.

In FIG. 5, the same reference numerals are used for components which are common with FIG. 2. In accordance with this invention, the feedback control system of FIG. 5, which is indicated generally at 40, comprises a dynamic bias control amplifier 42 to which is supplied with an RF level control voltage or control signal. The output from the dynamic bias control amplifier 42 supplies a variable reference voltage $V_{REF(V)}$ to the three RF amplifiers 22, 24 and 26 so that the operating bias point of these three amplifiers varies continuously and dependently with the desired resultant output level.

In practice $V_{REF(V)}$ is likely to be proportional to the collector voltage $V_c$ for the amplifiers 22, 24 and 26. The amplifiers 22, 24 and 26 may all operate with the same collector voltage $V_c$ although their collector currents $I_c$ will differ according to the value of their collector resistors $R_c$. In other embodiments, it may be desirable for the three amplifiers 22, 24 and 26 to operate at different collector voltages in which case a separate dynamic bias control amplifier may be provided for each RF amplifier.

Figure 6:
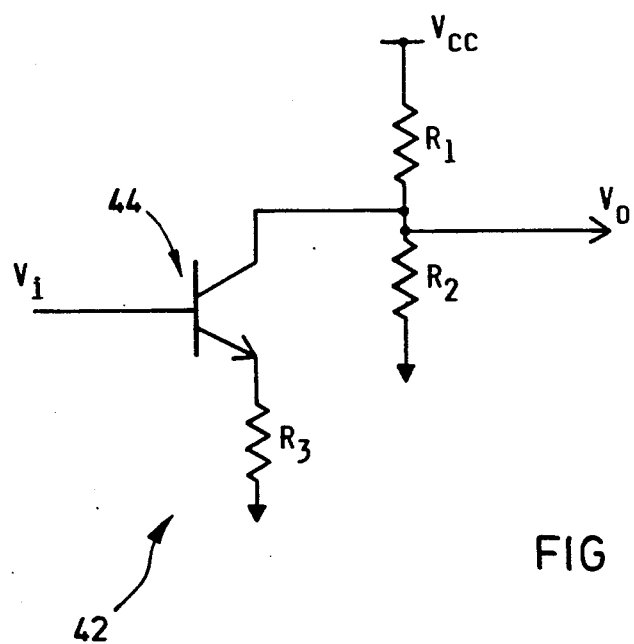
FIG. 6 is a schematic diagram of a dynamic bias control amplifier used in the control system of FIG. 5.

FIG. 6 shows the components of the dynamic bias amplifier 42 comprising a transistor 44 and three resistors $R_1$, $R_2$ and $R_3$. The emitter lead of the transistor 44 is connected via resistor $R_3$ to ground and the collector lead is connected to a voltage divider formed by resistors $R_1$ and $R_2$ which are connected to a supply voltage $V_{cc}$. The input voltage $V_1$ to base of the transistor 44 is equal to, or derived from, the RF level control voltage. The output voltage $V_c$ is equal to, or forms the basis of, the variable reference voltage $V_{REF(V)}$.

The output voltage $V_o$ is derived as follows:

$$V_o = \frac{V_{cc}}{R_1} + \frac{0.7}{R_3} - \frac{V_i}{R_3} \cdot \frac{1}{1/R_1 + 1/R_2}$$

assuming that the voltage drop across the base-emitter junction of the transistor 44 is 0.7 V.

Typical values for these variables are as follows:

$R_1 = 7.5$ k $R_2 = 10$ k $R_3 = 10$ k $V_i = 0$ to 8V $V_o = 9$ to 12 V $V_{cc} = 15$ V

Thus the control voltage for the automatic level control (ALC) loop is a signal which varies in proportion to the desired RF power and this signal is also used to control the ratio of $V_c$ and $I_c$ applied to one or, if used, more RF amplifiers.

Dynamic biasing in this way allows the operating bias point ($V_c$ and $I_c$) to be continuously varied as a function of desired output power. When a moderate output is desired, with good harmonics, a high value of $V_c$ can be used with a low value of $I_c$. When a high RF power with unspecified harmonics is required a high value of $I_c$ can be used. $V_c$ is reduced in sympathy with the increasing $I_c$ to maintain low dissipation.

The RF level control voltage could be generated in a variety of ways, including, for example, a variable voltage source, potential divider or microprocessor control circuit. A microprocessor control circuit for generating an RF level control voltage according to the invention is depicted in FIG. 7.

Figure 7:
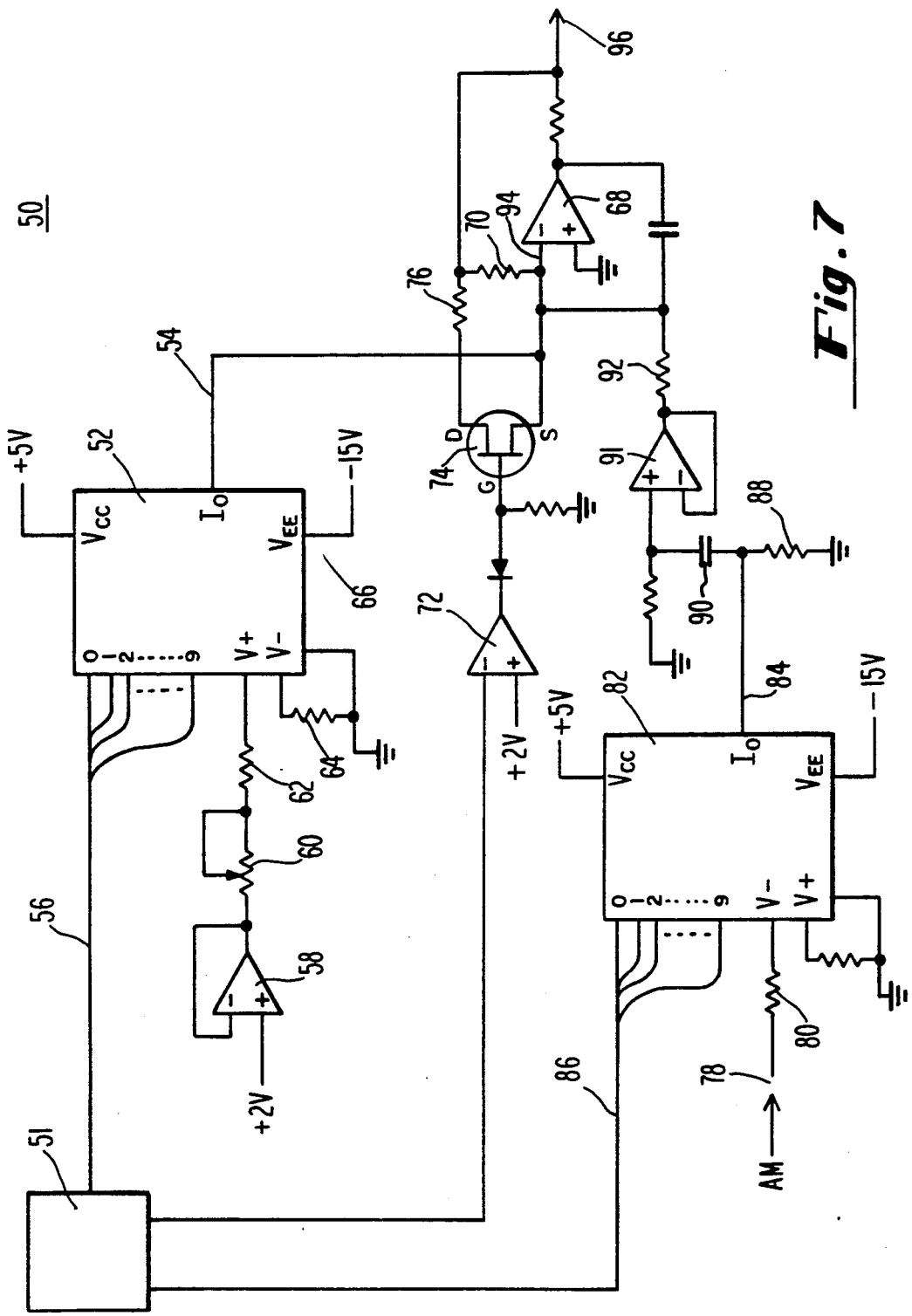
FIG. 7 is a schematic diagram of a microprocessor control circuit for generating an RF level control voltage according to the present invention.

Referring now to FIG. 7, circuitry for generating a microprocessor-controlled RF level control voltage is denominated generally as 50. Level DAC 52 provides a current output at pin 54, controlled by a ten bit digital word, 56, from a microprocessor 51. Level buffer 58,60 provides an adjustable dc reference voltage for DAC 52. The output current from pin 54, enters the current summing node at pin 94, of differential amplifier 68. The net current entering this junction flows through a resistor 70, and is converted to a voltage at the output of amplifier 68. Amplifier 72 and transistor 74 provide means for modifying the gain of amplifier 68 by placing resistor 76 in parallel with resistor 70.

A constant amplitude sine wave voltage 78 is applied to resistor 80 as the AM signal. This signal is scaled by multiplying DAC 82 to produce an output current at pin 84 of DAC 82. This current follows the sinusoidal input voltage 78, but is controlled in amplitude by a 10-bit digital word 86 from the microprocessor. The current at pin 84 is converted to a voltage by resistor 88, and ac coupled by capacitor 90 into buffer amplifier 91. The output voltage of amplifier 91 is converted to a current by resistor 92 and summed with the level DAC current at pin 94 of differential amplifier 68.

Thus, an RF level control voltage is provided at 96 which comprises a DC voltage with an amplitude controlled by a 10-bit digital word and input at 56. The DC voltage is superimposed by an ac signal input at 78. The amplitude of the resultant ac signal transmitted by DAC 82 is controlled by a second 10-bit digital word input at 86. When the RF level control voltage is passed to the level control loop of the dynamic bias amplifier 42, the RF signal level follows the instantaneous voltage, leading to amplitude modulated RF with controllable power and modulation depth.

It will be understood that the present invention is applicable to any RF amplifier where linearity and harmonic performance are important.

Minor modifications to reduce the effect of power dissipation in the detector diode 32 on the output signal $R_{Fout}$ (FIG. 5) may be made. For example the detector circuit 32 may be connected to the output of the second RF amplifier 24 or may be connected to an extra amplifier (not shown) which is connected to the output of the amplifier 24 and arranged in parallel with the amplifier 26. The number of RF amplifiers used in a feedback control circuit will of course vary according to requirements.

The invention may be implemented in the form of components surface mounted on a printed circuit board, as separate components hard-wired together, on a microprocessor or in any other suitable form. Although the present invention has been described with respect to an RF amplifier, it will be understood that the invention may be useful in relation to a DC amplifier.

Although a particular embodiment of the invention has been shown and described and other embodiments and modifications have been suggested, it will be understood that other embodiments and modifications will occur to those of ordinary skill in the art which will fall within the true spirit and scope of the invention as set forth in the appended claims.

I claim:

1. An amplifier circuit for generating an output voltage comprising:
    an amplifier having an input and an output;
    a biasing circuit for and coupled to said amplifier;
    control means for generating an amplifier output power level control voltage;
    means for comparing a signal indicative of said amplifier output power level with said output power level control voltage, generating a difference signal indicative of the difference between said signal indicative of said output power level and said output power level control voltage, and controlling the input power level of said amplifier on the basis of at least said difference signal; and
    means for coupling said control means to said biasing circuit in an open loop manner for dynamically controlling the operating point of said amplifier in response to the power level control voltage such that current and voltage parameters defining said operating point vary in opposite sense to one another in coordination with change in amplifier output power level, so as to control distortion and power dissipation.

2. The amplifier circuit of claim 1 wherein said biasing circuit comprises another amplifier.

3. The amplifier circuit of claim 1 wherein said amplifier comprises an RF amplifier.

4. The amplifier circuit of claim 1 wherein said control means comprises a microprocessor control circuit comprising a microprocessor and a digital to analog converter.

5. A method of operating an amplifier circuit comprising an amplifier and a biasing circuit for said amplifier, said method comprising the following steps:

operating said amplifier so as to produce an output signal;
    generating an amplifier output power level control voltage;
    applying said output power level control voltage to said biasing circuit in an open loop manner;
    comparing a signal indicative of the amplifier output power level with said output power level control voltage, generating a difference signal indicative of the difference between said signal indicative of said output power level and said output power level control voltage, and controlling the input power level of said amplifier on the basis of at least said difference signal; and
    dynamically controlling the operating bias point of said amplifier with said biasing circuit in response to said output power level control voltage such that current and voltage parameters defining said operating point vary in opposite sense to one another in coordination with change in amplifier output power level, so as to control distortion and power dissipation.

6. The method of claim 5 wherein said amplifier means comprises a plurality of cascaded amplifiers and further comprising the step of dynamically controlling the respective operating points of said plurality of cascaded amplifiers.

7. A system comprising:
    amplifier having an input and an output;
    control means for generating an amplifier output level control voltage;
    comparison means coupled to said amplifier and said control means for generating an error signal representing the difference between said output and said level control voltage;
    modulating means coupled to said amplifier and said comparison means for modulating the input to said amplifier with said error signal; and
    bias means coupled to said amplifier means and said control means as part of an open loop for varying the operating bias point of the amplifier in response to said level control voltage such that current and voltage parameters defining said operating point vary in opposite sense to one another, so as to control distortion and power dissipation.

8. The system of claim 7 wherein said amplifier means comprises a plurality of cascaded amplifiers coupled to said bias means.

9. The system of claim 7 wherein said amplifier means comprises an RF amplifier.

10. The system of claim 7 wherein said control means comprises a microprocessor control circuit comprising a microprocessor and a digital to analog converter.

* * * * *

UNITED STATES PATENT AND TRADEMARK OFFICE
CERTIFICATE OF CORRECTION

PATENT NO. : 5,136,257
DATED : August 4, 1992
INVENTOR(S) : Ian Reading

It is certified that error appears in the above-indentified patent and that said Letters Patent is hereby corrected as shown below:

On the Title page, item [30] under "Foreign Application Priority Data", change the country of priority from "[EP] European Pat. Off." to -- [UK] United Kingdom--.

Column 6, line 29, after "amplifier", insert --means--.

Signed and Sealed this

Ninth Day of November, 1993

Attest:

BRUCE LEHMAN

*Attesting Officer*  *Commissioner of Patents and Trademarks*